(12) United States Patent
Dai et al.

(10) Patent No.: US 7,593,498 B2
(45) Date of Patent: Sep. 22, 2009

(54) METHOD AND APPARATUS FOR AUTOMATIC RATE IDENTIFICATION AND CHANNEL SYNCHRONIZATION IN A MASTER-SLAVE SETTING FOR HIGH DATA THROUGHPUT APPLICATIONS

(75) Inventors: Xingdong Dai, Bethlehem, PA (US); Vladimir Sindalovsky, Perkasie, PA (US)

(73) Assignee: Agere Systems Inc., Allentown, PA (US)

( * ) Notice: Subject to any disclaimer, the term of this patent is extended or adjusted under 35 U.S.C. 154(b) by 550 days.

(21) Appl. No.: 11/541,398

(22) Filed: Sep. 29, 2006

(65) Prior Publication Data

US 2008/0080600 A1  Apr. 3, 2008

(51) Int. Cl.
*H04L 7/00* (2006.01)
*H04L 25/00* (2006.01)
*H04L 25/40* (2006.01)

(52) U.S. Cl. .................... 375/371; 375/372; 375/373; 375/374; 375/375; 375/376; 710/100; 710/110

(58) Field of Classification Search ......... 375/371–376; 710/100, 110
See application file for complete search history.

(56) References Cited

U.S. PATENT DOCUMENTS

2003/0217214 A1* 11/2003 Calvignac et al. ............ 710/305
2005/0169263 A1* 8/2005 Grottel et al. ............... 370/389

* cited by examiner

*Primary Examiner*—Curtis B Odom
(74) *Attorney, Agent, or Firm*—Ryan, Mason & Lewis, LLP (57) ABSTRACT

Methods and apparatus are provided for automatic rate identification and channel synchronization in a master-slave setting for high data throughput applications. An interface is provided for use between a parallel bus and a serial bus. The interface includes a plurality of serializer/deserializer circuits that generate a clock signal, wherein one of the serializer/deserializer circuits is a master circuit generating a master clock signal and the remaining of the serializer/deserializer circuits are slave circuits generating slave clock signals. The master clock signal is substantially phase-aligned to a reference clock and is distributed to the slave circuits. The interface also includes a clock divider associated with the master circuit for selectively generating a master clock signal having one or more lower data rates than the reference clock; and a frequency detector associated with each of the slave circuits for automatically detecting a rate of the master clock signal.

18 Claims, 8 Drawing Sheets

METHOD AND APPARATUS FOR AUTOMATIC RATE IDENTIFICATION AND CHANNEL SYNCHRONIZATION IN A MASTER-SLAVE SETTING FOR HIGH DATA THROUGHPUT APPLICATIONS

FIELD OF THE INVENTION

The present invention is related to techniques for increasing data throughput and, more particularly, to data rate identification techniques for an interface between a low-speed parallel bus and a high-speed serial bus.

BACKGROUND OF THE INVENTION

In order to achieve higher data throughput over a communication bus, a device can employ faster or wider buses, or both. A one-channel serializer/deserializer (SerDes) can be employed as a one-bit bus. In order to obtain the desired data throughput, multiple SerDes circuits are often employed in parallel. Each SerDes circuit typically has its own phase locked loop (PLL) circuit, and the PLLs on the multiple parallel SerDes circuits must operate synchronously. In addition, synchronization between different SerDes circuits at the transmitter is also desirable, because it simplifies data assembly at the receiver end.

A number of techniques have been proposed or suggested for maintaining synchronization among the multiple parallel SerDes circuits. For example, a reference clock that is external to the integrated circuit containing the multiple SerDes circuits has been used to synchronize the various PLLs on the multiple SerDes circuits. This technique, however, only supports synchronization at the full data rate of the reference clock. For different data rate applications, a different crystal oscillator is required to generate a reference clock associated with each data rate, thus increasing the cost of the system design.

A need therefore exists for improved methods and apparatus for maintaining channel synchronization among a plurality of SerDes circuits for such high data throughput applications.

SUMMARY OF THE INVENTION

Generally, methods and apparatus are provided for automatic rate identification and channel synchronization in a master-slave setting for high data throughput applications. According to one aspect of the invention, an interface is provided for use between a parallel bus and a serial bus. The interface includes a plurality of serializer/deserializer circuits that generate a clock signal, wherein one of the serializer/deserializer circuits is a master circuit generating a master clock signal and the remaining of the serializer/deserializer circuits are slave circuits generating slave clock signals. The master clock signal is substantially phase-aligned to a reference clock and is distributed to the slave circuits. The interface also includes a clock divider associated with the master circuit for selectively generating a master clock signal having one or more lower data rates than the reference clock; and a frequency detector associated with each of the slave circuits for automatically detecting a rate of the master clock signal.

The interface can also include a data interleaver in each of the serializer/deserializer circuits to handle data interleaving for the lower data rates. The master circuit optionally generates a double rate clock having a rate that is twice the rate of the master clock and wherein the double rate clock is distributed to the slave circuits. The slave circuits can also include a multiplexer for selecting an appropriate clock signal based on rate identification information from the corresponding frequency detector. In this manner, selected data rate information can be provided only to the master circuit. The interface can be further configured to compensate for a clock skew by identifying a phase of the master clock A more complete understanding of the present invention, as well as further features and advantages of the present invention, will be obtained by reference to the following detailed description and drawings.

DETAILED DESCRIPTION

The present invention provides methods and apparatus that allow multiple SerDes circuits to be used as a multi-bit high speed parallel bus. According to one aspect of the invention, the disclosed parallel bus supports multiple data rates and dynamic data rate switching. In addition, the data rate control signals only need to be sent to one master SerDes circuit. Using the clock from the master SerDes circuit, all other SerDes circuits can automatically detect the rate changes and be able to generate, for example, a clock output that has a double rate clock.

Figure 1:
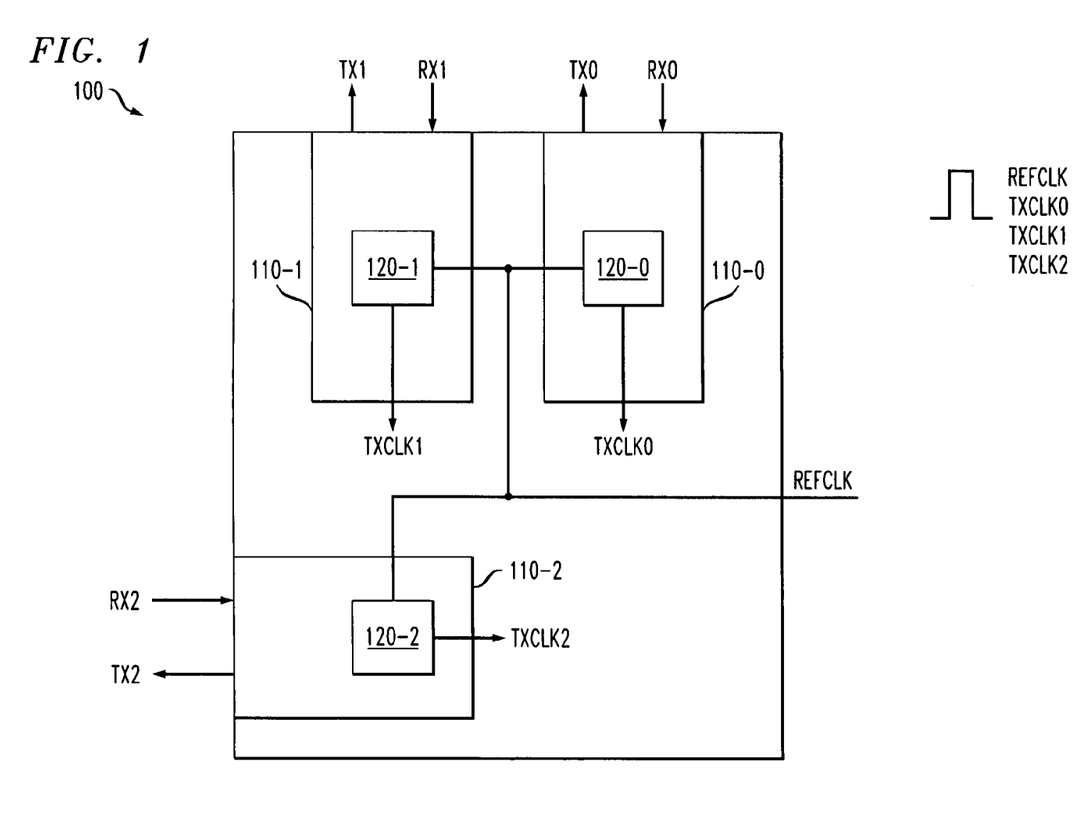
FIG. 1 illustrates a parallel bus interface between a low-speed parallel bus and a high-speed serial bus.

FIG. 1 illustrates a parallel bus interface 100 between a low-speed parallel bus and a high-speed serial bus. As shown in FIG. 1, the exemplary interface 100 is comprised of three SerDes circuits 110-0 through 110-2. Each SerDes circuit 110-0 through 110-2 includes a corresponding PLL 120-0 through 120-2. The PLLs 120 are used to generate serial bit clocks of a higher frequency from the reference clock (REFCLK). On the serial side of the interface 100, data is sent out on a precisely defined time interval. Deviations from this ideal time interval are referred to as jitter. Industry standards typically specify a maximum amount of tolerable jitter. A PLL 120 or a delay-locked-loop (DLL) is often employed to phase-align all data transfers to an input reference clock (REFCLK). As shown in FIG. 1, the reference clock can be generated by an off-chip crystal oscillator, and has a fixed frequency.

On the parallel transmit side of the interface 100, the SerDes circuits 110-$n$ output a transmit word clock (TXCLKn), which is also phase locked to the reference clock. Although not shown in the Figures for ease of illustration, parallel transmit data (TXDATA) is received with respect to the transmit clock TXCLKn. On the parallel receive side of the interface 100, received data (RXDATA) is sent out along with a recovered word clock (RXCLK) (not shown).

It is often desirable for a SerDes circuit to support multiple data rates. For example, the SerDes circuit model SDM8G09, commercially available from Agere Systems Inc. of Allentown, Pa., supports a full data rate of 8 Gbps, a half data rate of 4 Gbps, a quarter data rate of 2 Gbps, and an ⅛ data rate of 1 Gbps. The transmit and receive clocks TXCLK and RXCLK scale with the different data rate operations, so that the width of parallel transmit and receive data stays constant. As previously indicated, in high data throughput applications, multiple SerDes circuits 110 are grouped together to create a wider high-speed bus and are generally required to operate in a precisely synchronized manner.

As indicated above, at the full data rate, the SerDes circuits 110 can be synchronized by feeding in a single reference clock, as shown in FIG. 1, and having the PLLs 120 select a divide-by-1 ratio. In this setting, all the transmit clocks TXCLKn are the derived from the reference clock REFCLK. The reference clock REFCLK is generally fixed for the full data rate. Thus, for lower data rates, a clock divider must be used to generate the transmit clock TXCLK.

Figure 2:
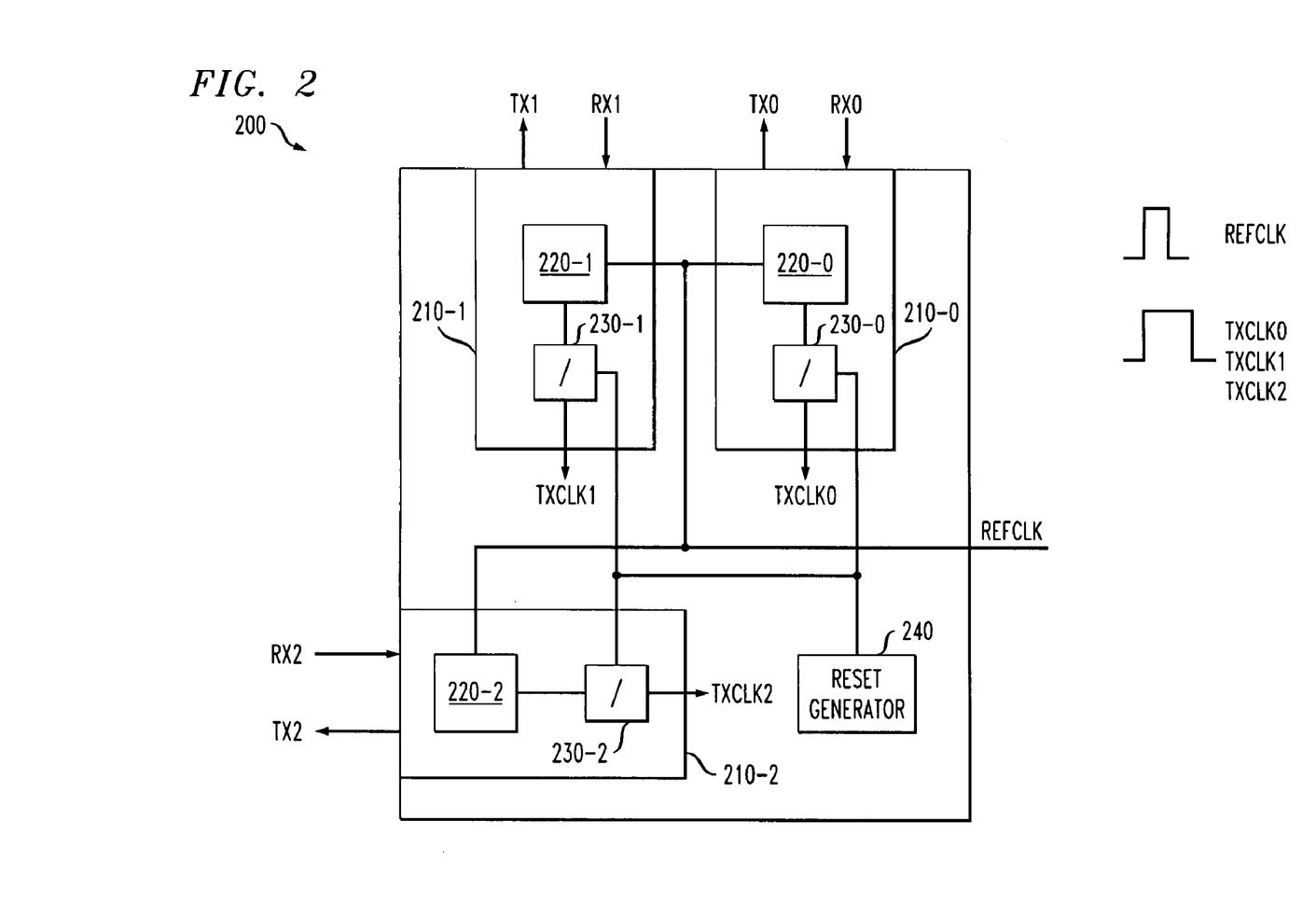
FIG. 2 illustrates a parallel bus interface where clock dividers are employed to achieve lower date rates than the frequency of the reference clock.

FIG. 2 illustrates a parallel bus interface 200 where clock dividers 230 are employed to achieve lower date rates than the frequency of the reference clock. As shown in FIG. 2, each SerDes circuit 210-0 through 210-2 includes a corresponding clock divider 230-0 through 230-2 to divide the clock signal of the associated PLL 220-0 through 220-2. Each clock divider 230 generates a lower rate clock than the frequency of the reference clock. It has been observed that unless the reset signal generated by reset generator 240 and applied to the dividers 230 is removed precisely at the same time for all SerDes circuits 210, the lower rate transmit clocks TXCLKn can be out of phase. The reset signal, however, is not typically subject to the same stringent timing requirement as clock signals.

In addition, high speed SerDes circuits 210 on start-up typically go through sophisticated tuning processes. Depending on the manufacturing processes, tuning time can vary widely, which makes precise reset release even more difficult to achieve.

Figure 3:
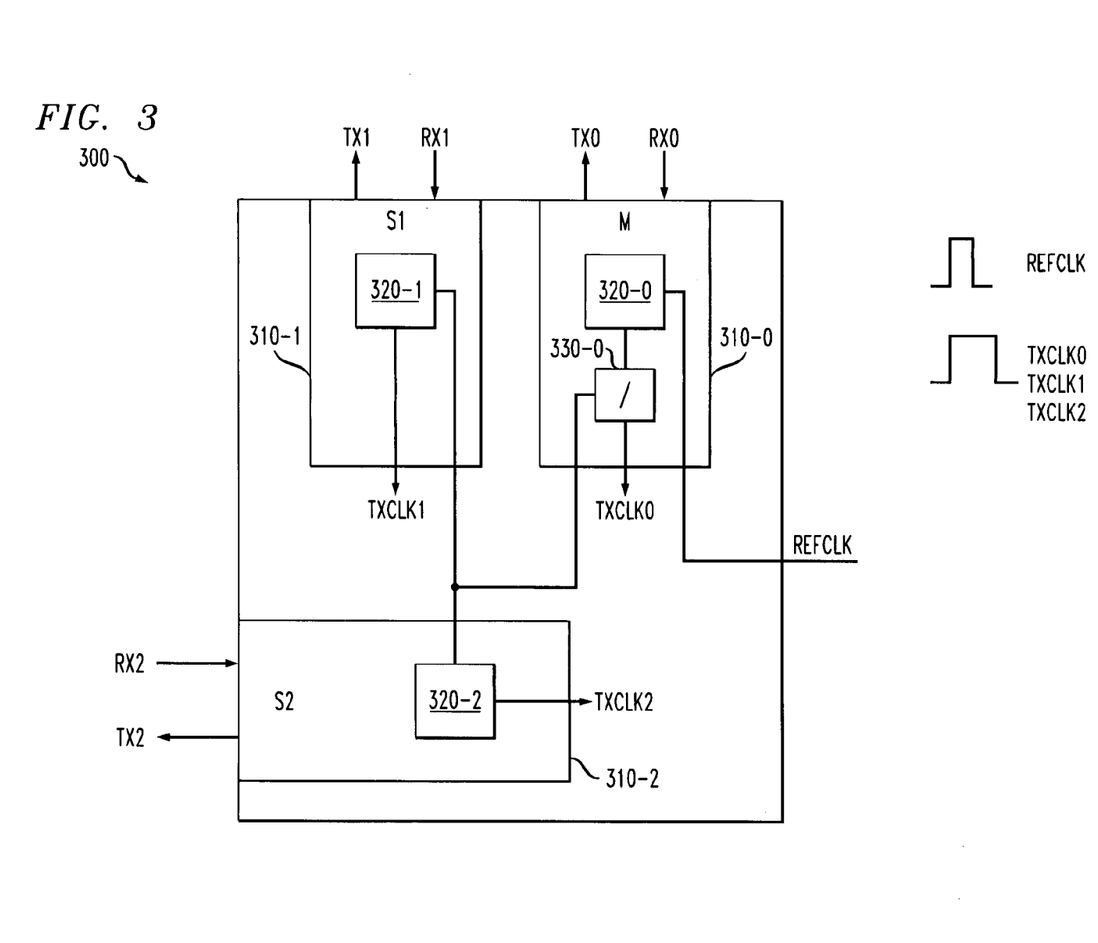
FIG. 3 illustrates a parallel bus interface where lower date rates are achieved using a master-slave method.

FIG. 3 illustrates a parallel bus interface 300 where lower date rates are synchronized using a master-slave method. As shown in FIG. 3, one SerDes circuit, such as circuit 310-0, is selected as the master circuit, and the remaining SerDes circuits 310-1 and 310-2 serve as slave circuits. The master circuit 310-0 supplies the transmit clock TXCLK as a clock (SLAVECLK) to the slave circuits 310-1 and 310-2. For very low data throughput applications, one can use this slave clock (SLAVECLK) as a reference clock to the slave circuits 310-1 and 310-2. However, this generated lower rate clock generally has very high jitter components. In addition, this configuration 300 typically does not sufficiently support on-the-fly rate changes. Generally, if the data rate of the master circuit 310-0 changes, then the clock period of the transmit clock TXCLK changes as well. The slave PLL 320-1 or 320-2 is perturbed and will need to re-acquire lock. This can take a relatively long time for the slave circuits to settle, and it may not meet many application needs. The PLL may not support the wide frequency range necessary to implement this solution.

In the embodiment of FIG. 3, the divided clock of the master circuit 320-0 is applied to the slave circuits 310-1 and 310-2. Thus, a reset signal is not required.

Figure 4:
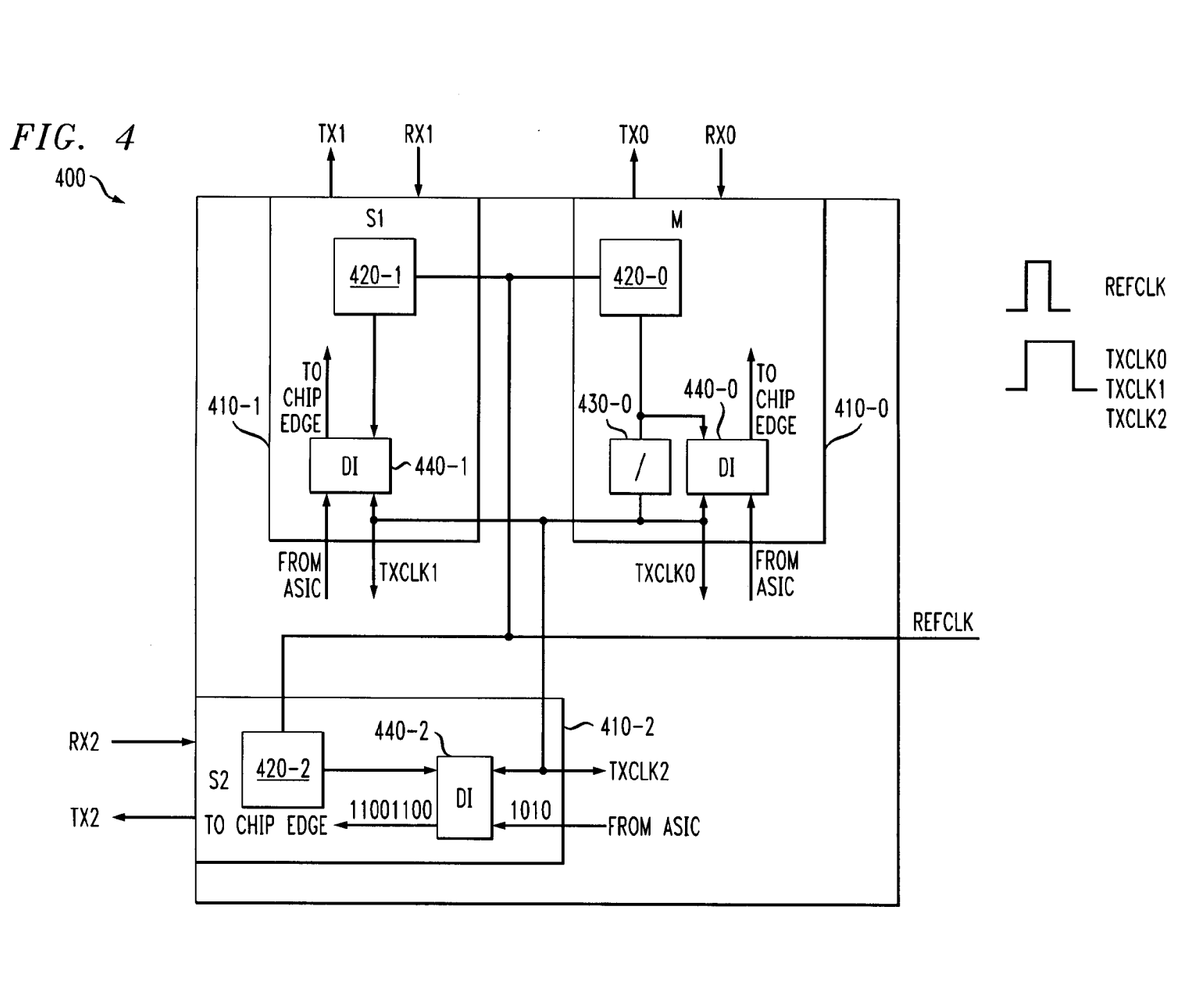
FIG. 4 illustrates a parallel bus interface where lower date rates are achieved using a further variation of the master-slave method of FIG. 3.

FIG. 4 illustrates a parallel bus interface 400 where lower date rates are achieved using a further variation of the master-slave method of FIG. 3. The implementation of FIG. 4 maintains the clean reference clock REFCLK to both the master and slave circuits 410-0 through 410-2, so that the high speed serial side of the interface 400 is always working at the full data rate. The master TXCLK0 is only fed to the parallel side of the slave circuits 410-1 and 410-2. As shown in FIG. 4, the parallel side logic of each SerDes circuit 410 includes a data interleaver (DI) 440-0 through 440-2 to handle data interleaving for lower data rates. Since the master full rate clock and slave full rate clocks are all phase-locked to the reference clock, the master clock TXCLK0 can be considered a divided slave full rate clock as well. In this way, lower rate data can be directly sampled by the slave full rate clock and be transmitted synchronously with the master circuit 410-0.

Parallel transmit data (TXDATA) is entering the data interleavers (DIs) 440-0 through 440-2 from the ASIC core. Serial transmit data exits the data interleavers 440 going to the chip edge.

The present invention recognizes that one of the challenges in the configuration of FIG. 4 is that when the master circuit 410-0 changes the data rate, this information needs to be conveyed to the slave circuits 410-1 and 410-2. A number of conventional techniques for changing the data rate employed a register access method, or a broadcast of data rate control signals.

The embodiment 400 shown in FIG. 4 only requires one frequency divider 430-0 in the master circuit 410-0. In this manner, the challenging task of synchronizing the slave frequency dividers is avoided, which requires synchronizing the release of resets to the divider.

Figure 5:
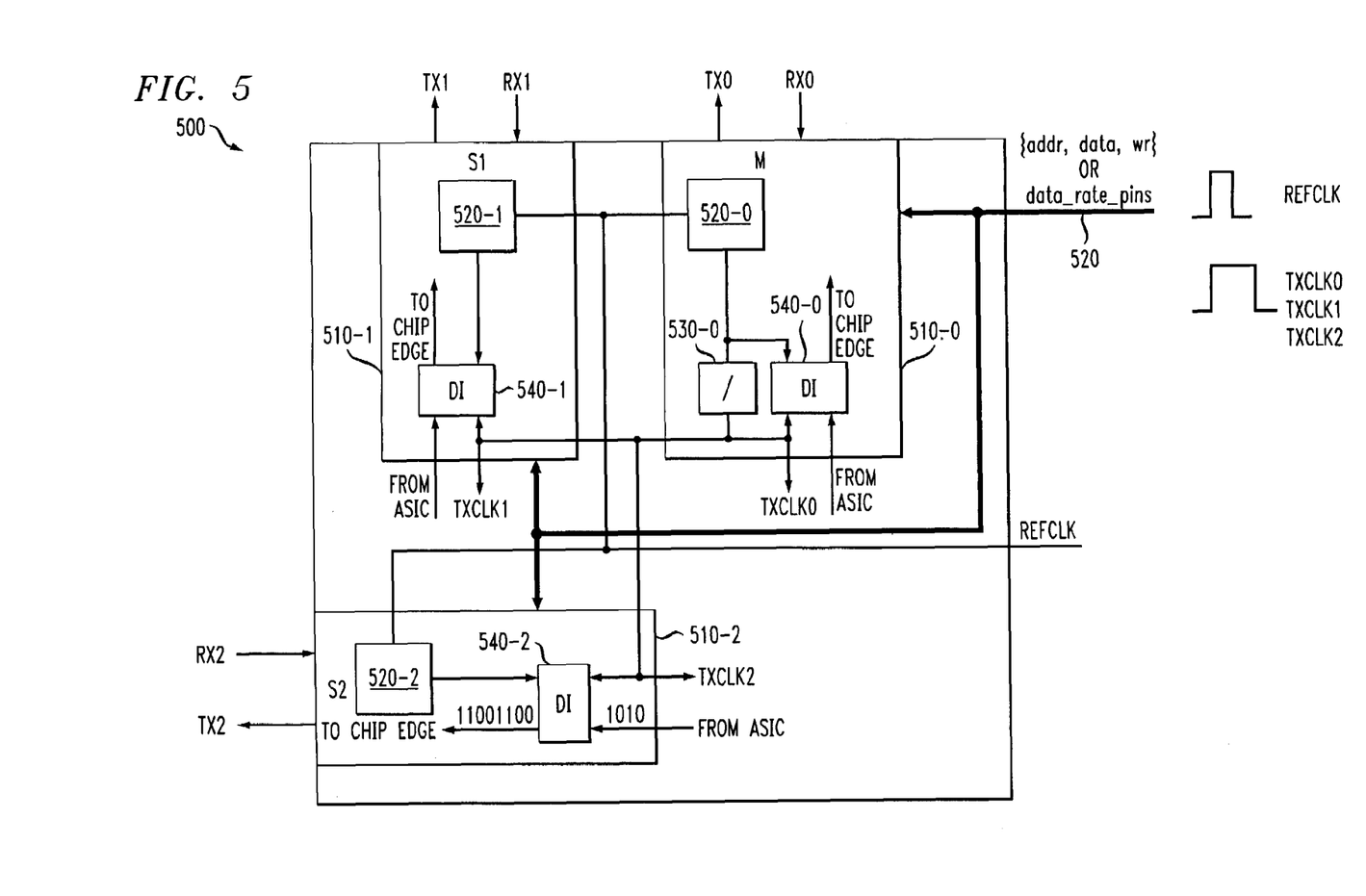
FIG. 5 illustrates a parallel bus interface employing the master-slave method of FIGS. 3 and 4 and incorporating a data rate identification mechanism.

FIG. 5 illustrates a parallel bus interface 500 employing the master-slave method of FIGS. 3 and 4 and incorporating a data rate identification mechanism. The exemplary interface 500 includes slave circuits 510-1 and 510-2, in a similar manner to FIG. 4. In addition, the exemplary interface 500 includes one or more pins for address, data, write strobe commands, or a data rate signal. For example, the conventional register access method requires interface pins, such as address, data and write strobe signals. It has been found, however, that configuration of the interface 500 via a register writes is slow. The broadcast method adds data rate pins to the interface 500 and the SerDes circuits 510. The wiring of these control signals to all slave circuits 510-1 and 510-2 can be area consuming.

The present invention recognizes that the data rate information is embedded in the master TXCLK0 generated by the exemplary master circuit 420-0, that has been sent to the slave circuits 420-1 and 420-2. Thus, in an implementation in accordance with the present invention, the data rate signals to the slave circuits through register access and pin access are not needed. Only the master circuit needs to receive the selected data rate information.

Figure 6:
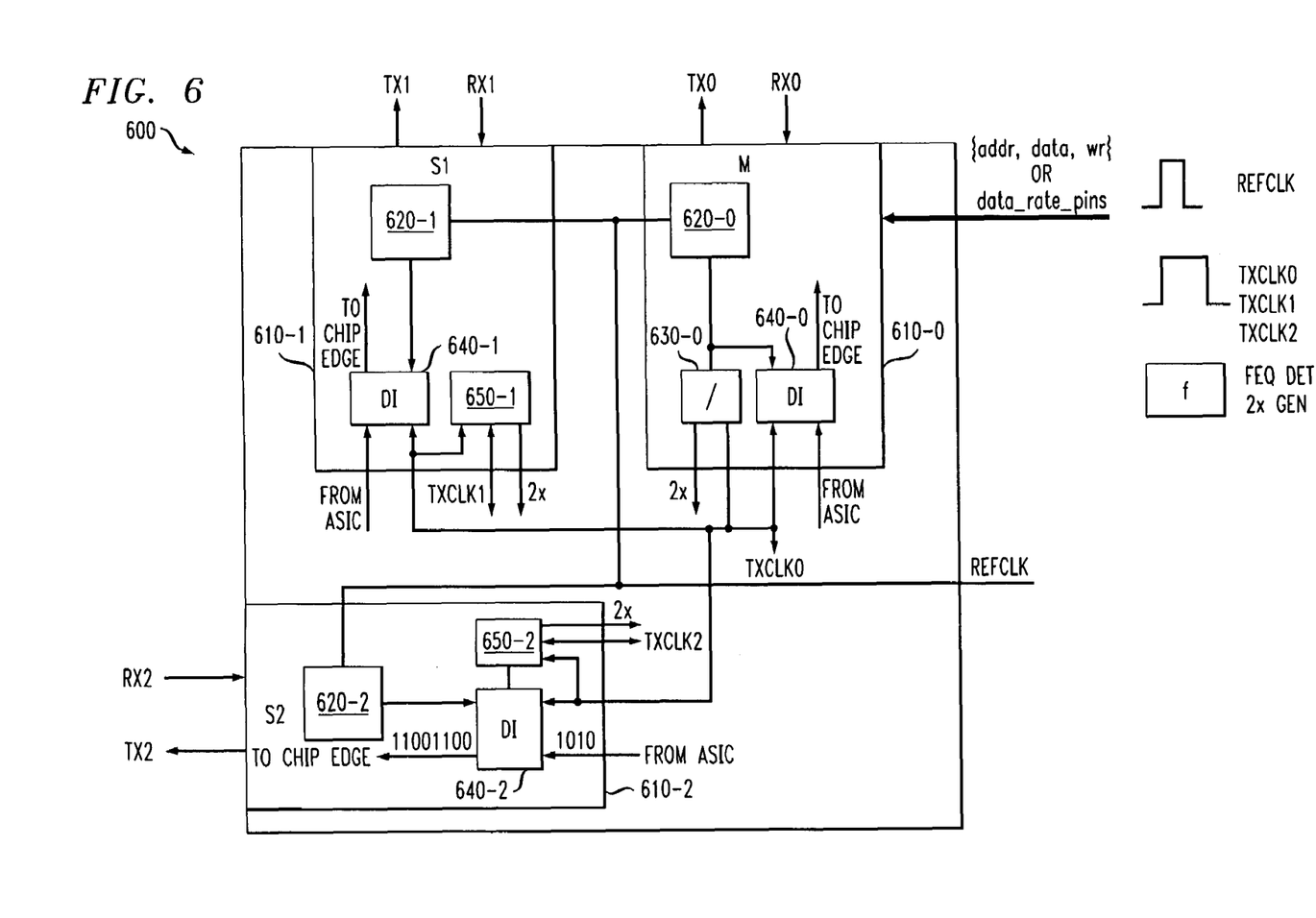
FIG. 6 illustrates a parallel bus interface incorporating features of the present invention.

FIG. 6 illustrates a parallel bus interface 600 incorporating features of the present invention. The interface 600 employs the master-slave method of FIGS. 3 and 4. The master TXCLK0 is either a full rate version of the clock REFCLK, or a lower data rate clock that was generated by applying the output of PLL 620-0. The data rate can be extracted from the TXCLK0 signal distributed to the slave circuits 610-1 and 610-2 using a corresponding frequency detector 650-1 and 650-2. The frequency detectors 650-1 and 650-2 may be implemented, for example, as clock pulse counters. According to one aspect of the invention, the rate identification can be completed automatically and quickly. In this manner, rate negotiation tasks are easier for end-systems.

Figure 7:
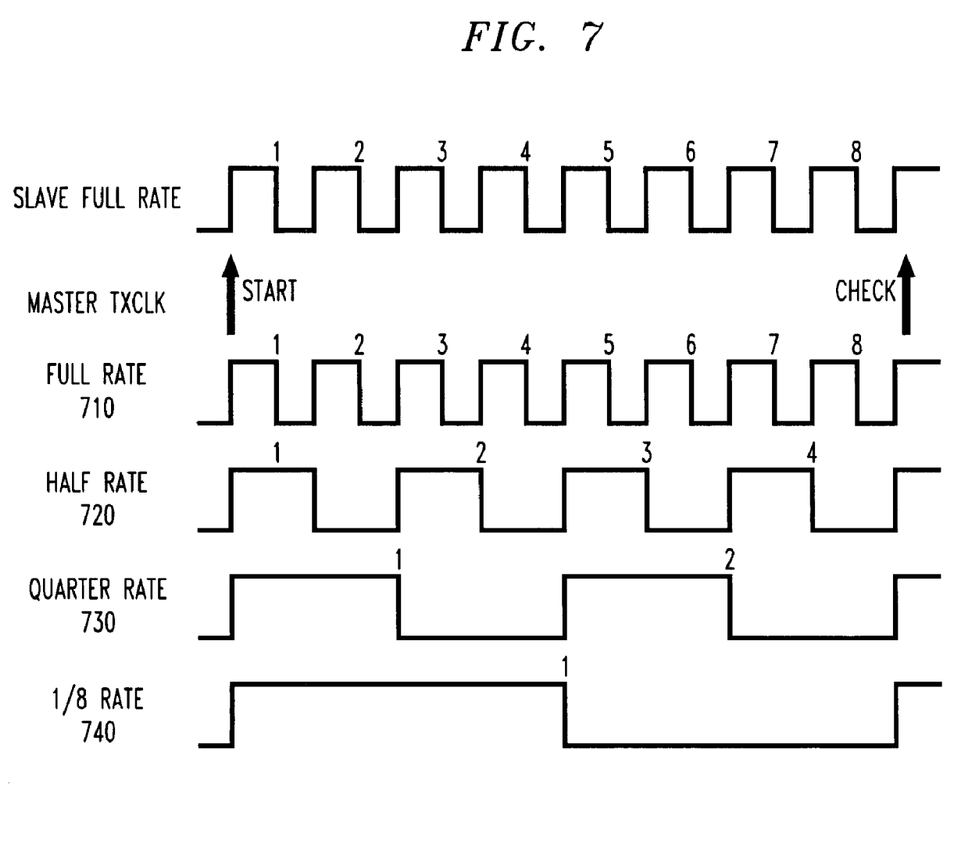
FIG. 7 illustrates the detection of the master data rate from TXCLK0 using the slave full rate clock.

FIG. 7 illustrates the detection of master data rate from TXCLK0 using the slave full rate clock at 650-1 and 650-2. As shown in FIG. 7, based on the counter value of the slave full rate clock and that of the TXCLK0 (710, 720, 730, or 740), the data rate of the master macro can be uniquely identified.

In many applications, a double-rate TXCLK output (T2CLK) is often required from all SerDes circuits 610. For example, in a large application-specific semiconductor (ASIC) design, the double-rate clock T2CLK is used to facilitate data transfer between a narrow parallel bus and a wide parallel bus. In the master circuit 610-0 of FIG. 6, the double-rate clock can be readily generated from PLL 620-0. In the slave circuits 610-1 and 610-2, the respective frequency detectors 650-1 and 650-2 can identify phase information, and select the proper double rate slave T2CLK output.

Figure 8:
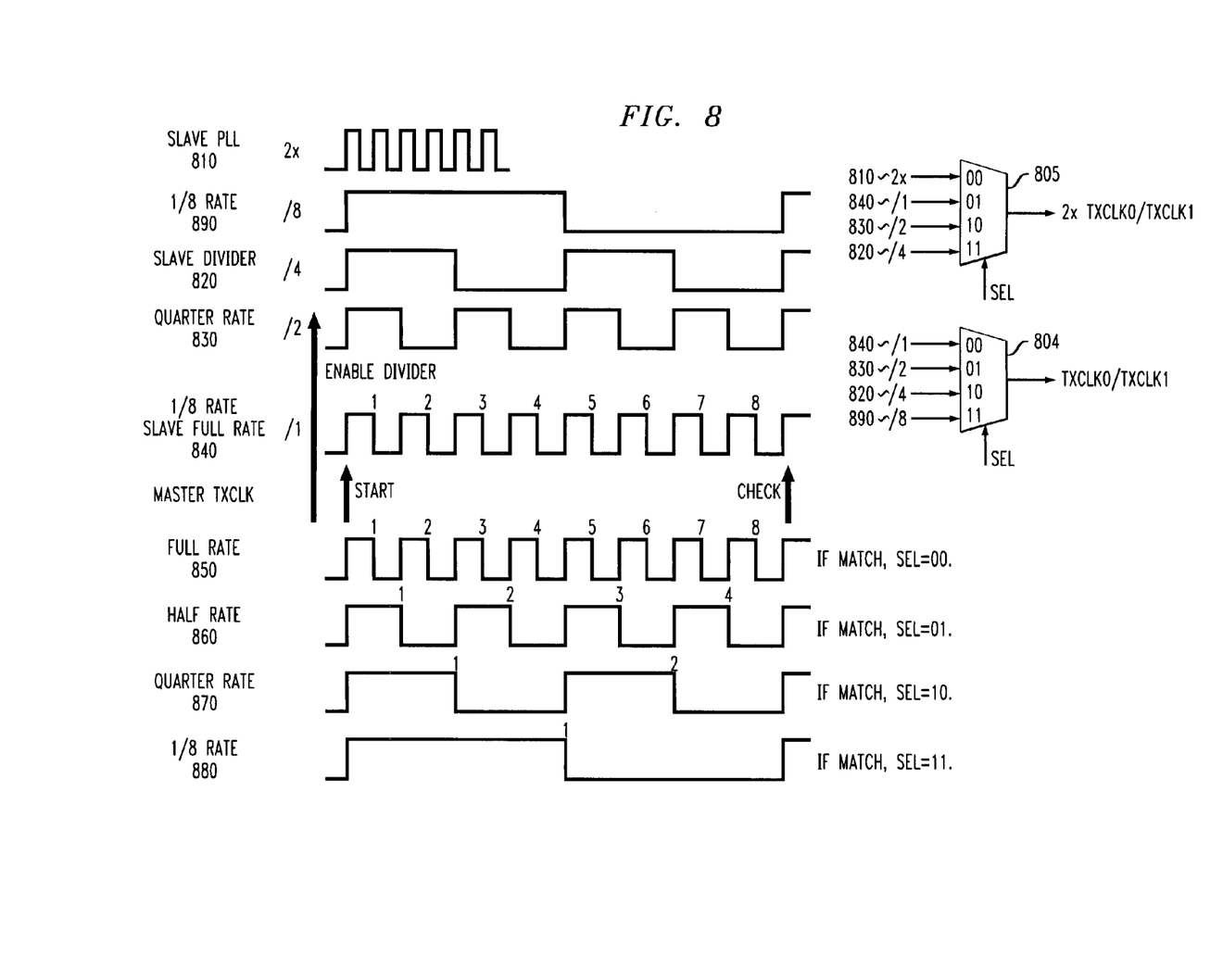
FIG. 8 illustrates the generation of the double rate clock by the master circuit 610-0 of FIG. 6.

FIG. 8 illustrates the generation of the full rate slave clock and the double rate slave clock by the slave circuits 610-1 and 610-2 of FIG. 6. As shown in FIG. 8, the slave PLLs 620-1 and 620-2 can generate a full rate clock 840, half rate clock 830, quarter rate clock 820, ⅛ rate clock 890 and a 2× rate clock 810. In addition, the slave PLLs 620-1 and 620-2 will receive the master TXLCK0 clock from the master circuit 610-0. The master TXLCK0 clock can be a full rate clock 850, half rate clock 860, quarter rate clock 870 or an ⅛ rate clock 880. Based on the frequency detected by the respective frequency detectors 650-1 and 650-2, the appropriate full rate slave clock (TXCLK1 and TXCLK2) is generated by a multiplexer 804, and the appropriate double rate clock (2× TXCLK1 and TXCLK2) is generated by a multiplexer 805.

The present invention allows the frequency of the master clock to be identified, and also provides compensation for the clock skew by identifying the clock phase. As shown in FIG. 4, TXCLK0 is buffered as TXCLK1 and TXCLK2. Due to the placement of macros, there are skews between clocks. Since full data rate clocks for all macros are phased locked by the PLL, the skew is minimal. The phase information can be used to regenerate the TXCLK1 and TXCLK2 which has very little skew to TXCLK0.

A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits.

It is to be understood that the embodiments and variations shown and described herein are merely illustrative of the principles of this invention and that various modifications may be implemented by those skilled in the art without departing from the scope and spirit of the invention.

We claim:

1. An interface for use between a parallel bus and a serial bus, comprising:
   a plurality of serializer/deserializer circuits that generate a clock signal, wherein one of said serializer/deserializer circuits is a master circuit generating a master clock signal and the remaining of said serializer/deserializer circuits are slave circuits generating slave clock signals, wherein said master clock signal is distributed to said slave circuits and wherein said master clock is substantially phase-aligned to a reference clock;
   a clock divider associated with said master circuit for selectively generating a master clock signal having one or more lower data rates than said reference clock; and
   a frequency detector associated with each of said slave circuits for automatically detecting a rate of said master clock signal.

2. The interface of claim 1, further comprising a data interleaver in each of said serializer/deserializer circuits to handle data interleaving for said lower data rates.

3. The interface of claim 1, wherein said master circuit generates a double rate clock having a rate that is twice the rate of said master clock and wherein said double rate clock is distributed to said slave circuits.

4. The interface of claim 1, wherein said slave circuits further comprise a multiplexer for selecting an appropriate clock signal based on rate identification information from said corresponding frequency detector.

5. The interface of claim 1, wherein selected data rate information is provided only to said master circuit.

6. The interface of claim 1, wherein said interface is configured to compensate for a clock skew by identifying a phase of said master clock.

7. A method for use between a parallel bus and a serial bus, comprising:
   generating a plurality of clock signals using a plurality of serializer/deserializer circuits, wherein one of said serializer/deserializer circuits is a master circuit generating a master clock signal and the remaining of said serializer/deserializer circuits are slave circuits generating slave clock signals;
   distributing said master clock signal to said slave circuits and wherein said master clock is substantially phase-aligned to a reference clock;
   selectively generating a master clock signal having one or more lower data rates than said reference clock using a clock divider associated with said master circuit; and
   automatically detecting a rate of said master clock signal using a frequency detector associated with each of said slave circuits.

8. The method of claim 7, further comprising the step of performing data interleaving in each of said serializer/deserializer circuits for said lower data rates.

9. The method of claim 7, further comprising the steps of generating a double rate clock in said master circuit having a rate that is twice the rate of said master clock and distributing said double rate clock to said slave circuits.

10. The method of claim 7, further comprising the step of selecting an appropriate clock signal in said slave circuits based on rate identification information from said corresponding frequency detector.

11. The method of claim 7, further comprising the step of providing selected data rate information only to said master circuit.

12. The method of claim 7, further comprising the step of compensating for a clock skew by identifying a phase of said master clock.

13. An integrated circuit, comprising:
an interface for use between a parallel bus and a serial bus, comprising:
a plurality of serializer/deserializer circuits that generate a clock signal, wherein one of said serializer/deserializer circuits is a master circuit generating a master clock signal and the remaining of said serializer/deserializer circuits are slave circuits generating slave clock signals, wherein said master clock signal is distributed to said slave circuits and wherein said master clock is substantially phase-aligned to a reference clock;
a clock divider associated with said master circuit for selectively generating a master clock signal having one or more lower data rates than said reference clock; and
a frequency detector associated with each of said slave circuits for automatically detecting a rate of said master clock signal.

14. The integrated circuit of claim 13, further comprising a data interleaver in each of said serializer/deserializer circuits to handle data interleaving for said lower data rates.

15. The integrated circuit of claim 13, wherein said master circuit generates a double rate clock having a rate that is twice the rate of said master clock and wherein said double rate clock is distributed to said slave circuits.

16. The integrated circuit of claim 13, wherein said slave circuits further comprise a multiplexer for selecting an appropriate clock signal based on rate identification information from said corresponding frequency detector.

17. The integrated circuit of claim 13, wherein selected data rate information is provided only to said master circuit.

18. The integrated circuit of claim 13, wherein said interface is configured to compensate for a clock skew by identifying a phase of said master clock.

* * * * *